(12) United States Patent
Hong

(10) Patent No.: US 8,216,481 B2
(45) Date of Patent: Jul. 10, 2012

(54) PROCESS FOR FABRICATING ULTRA-NARROW DIMENSION MAGNETIC SENSOR

(75) Inventor: Liubo Hong, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 328 days.

(21) Appl. No.: 12/581,030

(22) Filed: Oct. 16, 2009

(65) Prior Publication Data

US 2011/0089139 A1 Apr. 21, 2011

(51) Int. Cl.
*B44C 1/22* (2006.01)
(52) U.S. Cl. ............... 216/22; 216/66; 216/72; 216/74; 438/712; 438/713
(58) Field of Classification Search .............. 216/22, 216/66, 72, 74; 438/712, 713
See application file for complete search history.

(56) References Cited

U.S. PATENT DOCUMENTS

| | | | |
|---|---|---|---|
| 6,002,553 A | 12/1999 | Stearns et al. | 360/113 |
| 6,700,759 B1 | 3/2004 | Knapp et al. | 360/324.2 |
| 6,884,734 B2 | 4/2005 | Buehrer et al. | 438/723 |
| 7,026,247 B2 | 4/2006 | Dokumaci et al. | |
| 7,467,458 B2 | 12/2008 | Lin | 29/603.01 |
| 7,469,467 B2 | 12/2008 | Gao et al. | 29/603.16 |
| 2005/0147924 A1* | 7/2005 | Cornwell et al. | 430/320 |
| 2005/0233258 A1 | 10/2005 | Chen et al. | 430/312 |
| 2006/0273066 A1 | 12/2006 | Bedell et al. | 216/22 |
| 2007/0178609 A1 | 8/2007 | Yoda | |
| 2008/0062584 A1* | 3/2008 | Freitag et al. | 360/324.11 |
| 2008/0145773 A1 | 6/2008 | Wang et al. | 430/22 |
| 2008/0148552 A1* | 6/2008 | Pentek et al. | 29/603.01 |
| 2008/0260941 A1 | 10/2008 | Jin | 427/126.4 |
| 2009/0011367 A1 | 1/2009 | Omatsu et al. | |
| 2010/0167181 A1 | 7/2010 | Kim | |
| 2010/0321831 A1* | 12/2010 | Demtchouk et al. | 360/235.4 |
| 2010/0326819 A1 | 12/2010 | Lille et al. | |
| 2011/0089140 A1* | 4/2011 | Hong | 216/22 |

OTHER PUBLICATIONS

U.S. Appl. No. 12/581,042, filed Oct. 16, 2009.
Non-Final Office Action Summary from U.S. Appl. No. 12/581,042 dated Jan. 3, 2012.
IBM (IPCOM000018953D, "Self Aligned Undercut Structure Using Tungsten Hard Mask", Aug. 22, 2003, IP.com, 10 pages).
Yong Kwan Kim et al., "Focused Ion Beam Nanopatterning for Oploelectronic Device Fabrication" IEEE Journal of Selected Topics in Quantum Electronics, vol. 11, No. 6, Nov./Dec. 2005, p. 1292-1298.
S. Gupta et al., "Device Fabrication for Data Storage, Semiconductor and MEMS Applications at the University of Alabama Microfabrication Facility" IEEE 2008, p. 35-40.
"Self alined undercut structure using tungsten hard mask" IPCOM000018953D, IBM, IP.com, Inc., Aug. 22, 2003.

(Continued)

*Primary Examiner* — Binh X Tran
(74) *Attorney, Agent, or Firm* — Zilka-Kotab, PC

(57) ABSTRACT

A method for manufacturing a magnetoresistive read sensor that allows the sensor to be constructed with clean well defined side junctions, even at very narrow track widths. The method involves using first and second etch mask layers, that are constructed of materials such that the second mask (formed over the first mask) can act as a mask during the patterning of the first mask (bottom mask). The first mask has a well defined thickness that is defined by deposition and which is not affected by the etching processes used to define the mask. This allows the total ion milling etch mask thickness to be well controlled before the ion milling process used to define the sensor side walls.

20 Claims, 18 Drawing Sheets

OTHER PUBLICATIONS

"Magneto-resistive sensor with in-plane edge junction" IPCOM000016663D. IP.com. Inc., Jul. 8, 2003.

M-C Cyrille, et al., Nano Processing Strategies for MR Sensor Read Width and Stripe Height Formation; 2006.

* cited by examiner

US 8,216,481 B2

PROCESS FOR FABRICATING ULTRA-NARROW DIMENSION MAGNETIC SENSOR

RELATED INVENTIONS

This invention is related to commonly assigned patent application Ser. No. 12/581,042, entitled PROCESS FOR FABRICATING AN ULTRA-NARROW TRACK WIDTH MAGNETIC SENSOR, filed Oct. 16, 2009.

FIELD OF THE INVENTION

The present invention relates to magnetic tunnel transistors and more particularly to a method for manufacturing a magnetoresistive sensor having an ultra-narrow track-width and well controlled junction side profile.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic signals from the rotating disk. The read and write heads are connected to processing circuitry that operates according to a computer program to implement the writing and reading functions.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

The push for ever increased data rate and data capacity has lead a drive to increase the performance and decrease the size of magnetoresistive sensors. Such efforts have lead to an investigation into the development of tunnel junction sensor or tunnel valves. A tunnel valve operates based on the quantum mechanical tunneling of electrons through a thin electrically insulating barrier layer. A tunnel valve includes first and second magnetic layers separated by a thin, non-magnetic barrier. The probability of electrons passing through the barrier layer depends upon the relative orientations of the magnetic moment of the first and second magnetic layers. When the moments are parallel, the probability of electrons passing through the barrier is at a maximum, and when the moments are antiparallel, the probability of electrons passing through the barrier is at a minimum.

This push for ever greater data density has also lead researchers seek means for decreasing the dimensions of magnetoresistive sensors, especially the track-width of such sensors. However, manufacturing limitations have limited the ability to reliably reduce the track-width of such sensors, while also maintaining controllability of well defined side junction profiles of the sensors.

SUMMARY OF THE INVENTION

The present invention provides a method for manufacturing a magnetoresistive sensor that forms the sensor with clean, well defined side walls even at very narrow track widths. The method includes first forming a substrate, which is preferably an electrically conductive magnetic lead/shield and then depositing a plurality of sensor layers onto the substrate. After depositing the plurality of sensor layers, a first etch mask layer is deposited, the first etch mask layer being deposited to a thickness (T). Then, a second etch mask layer is deposited onto the first etch mask layer. The first etch mask layer is removable by one RIE chemistry, and the second etch mask layer by another chemistry. The first etch mask layer is also resistant to ion milling. A bottom anti-reflective coating is then deposited over the second etch mask layer, and a photoresist is deposited over the bottom anti-reflective layer. The photoresist layer is then developed to form a photoresist mask. A reactive ion etching is performed in the second chemistry to transfer the image of the photoresist mask onto the underlying second mask layer, and then a second reactive ion etching is performed in the first chemistry to transfer the image of the second etch mask layer onto the underlying first etch mask layer, the second etch mask being substantially unaffected by the second reactive ion etching in the first chemistry such that the thickness of the second etch mask remains substantially intact throughout the second etch process. An ion milling process is then performed to form first and second side walls on the plurality of the sensor layers, the ion milling process being performed at various angles so that shadowing from the first and second etch masks allows the ion milling to form the sides as clean, uniform, well defined side walls.

The process advantageously maintains, prior to the ion milling process, the thickness (ie. height) of the first etch mask plus the second etch mask which combine as etching mask for the subsequent ion milling process, as well as the lateral dimension of the first etch mask so as to provide a predictable amount of shadowing during the ion milling. What's more, the thickness of the combined mask layers can be easily, accurately and repeatably defined by deposition of the first and second etch mask layers.

In another aspect of the invention, the bottom anti-reflective coating layer can be constructed of an inorganic BARC material and can function both as a BARC layer and as a second etch mask layer. This reduces the number of layers and steps necessary to define the sensor.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
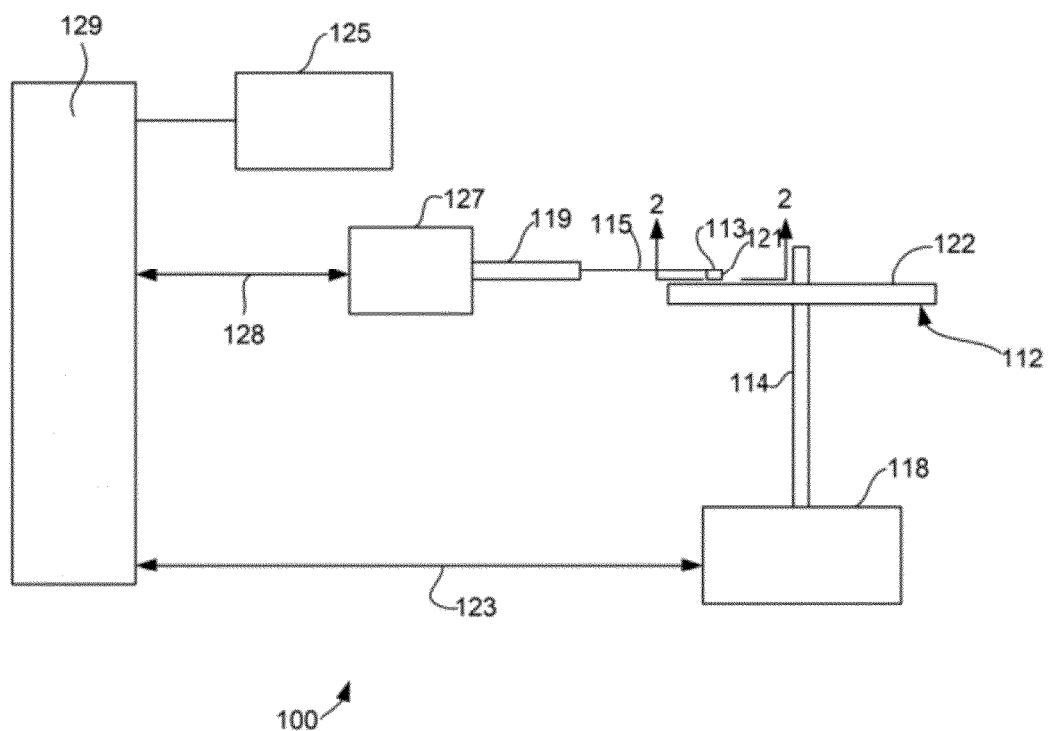
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are read from or written to. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
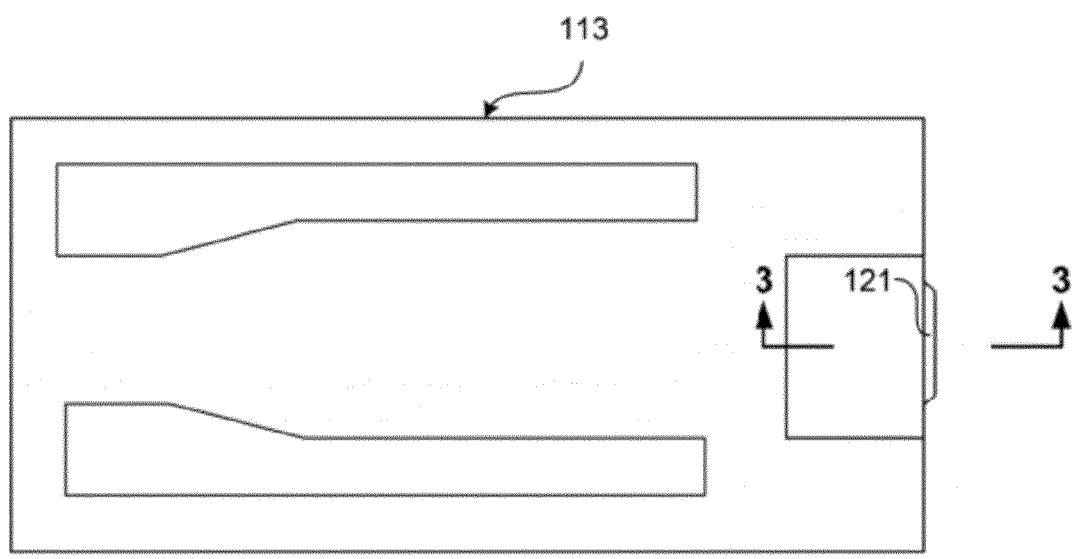
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
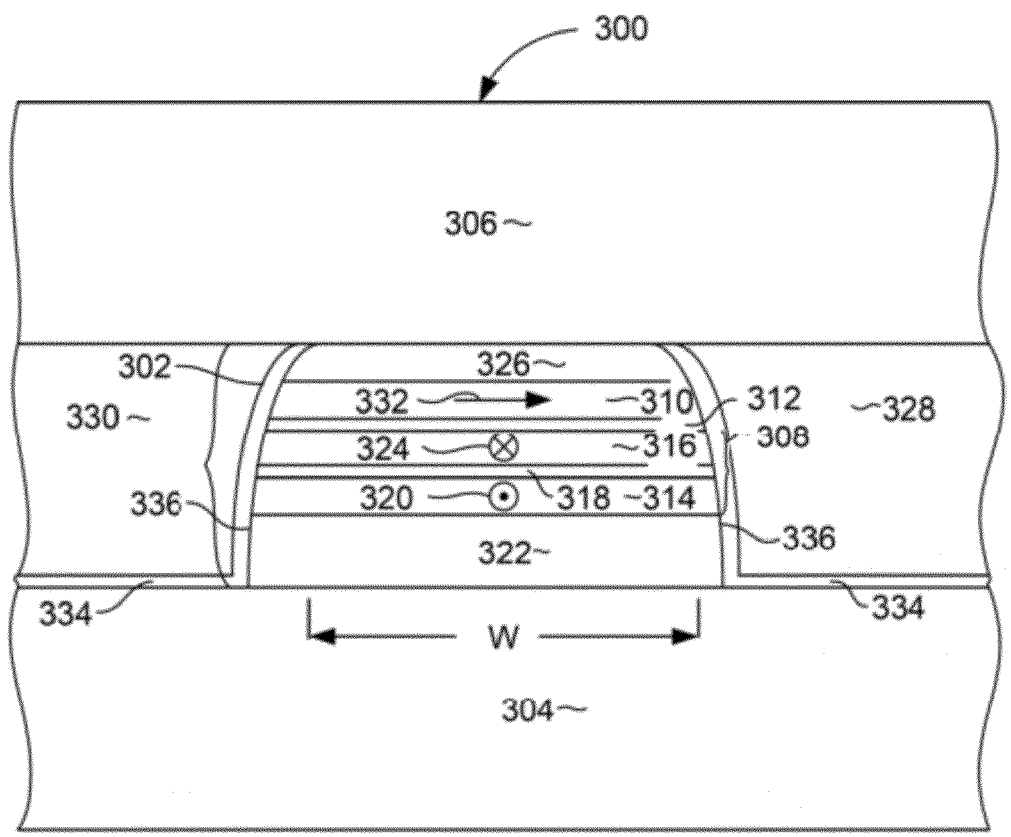
FIG. 3; is an enlarged ABS view of a magnetoresistive sensor such as can be manufactured according to an embodiment of the invention.

With reference now to FIG. 3, a schematic illustration is shown of a magnetoresistive sensor 300 as viewed from a plane parallel with the Air Bearing Surface (ABS). The sensor 300 includes a sensor stack 302 that is sandwiched between first and second electrically conductive shields 304, 306 that can be constructed of a magnetic material so that they can function as magnetic shields as well as electrical leads.

The sensor stack 302 can include a magnetic pinned layer structure 308, a magnetic free layer structure 310 and a non-magnetic spacer or barrier layer 312 sandwiched there-between. If the sensor 300 is a giant magnetoresistive sensor (GMR) the layer 312 will be an electrically conductive, non-magnetic spacer layer constructed of a material such as Cu. If the sensor 300 is a tunnel junction magnetoresistive sensor (TMR) the layer 312 will be a thin, non-magnetic electrically insulating barrier layer such as MgO, $Al_2O_3$ or $TiO_2$.

The pinned layer structure 308 can be an antiparallel coupled structure that includes first and second magnetic layers AP1 314 and AP2 316, which are antiparallel coupled across a thin, non-magnetic AP coupling layer 318 such as Ru. The AP1 layer 314 has magnetization that is pinned in a first direction perpendicular to the ABS as indicated by arrow-head symbol 320. Pinning of the magnetization 320 is achieved by exchange coupling with a layer of antiferromagnetic material (AFM) layer 322, which may be a material such as PtMn, IrMn or some other suitable material. Antiparallel coupling between the AP1 layer 314, and AP2 layer 316 pins the magnetization of the AP2 layer 316 in a second direction perpendicular to the ABS as indicated by arrow tail symbol 324.

In addition to the free layer 310, pinned layer structure 308 and spacer or barrier layer 312, capping layers 326 such as Ru and/or Ta may be provided at the top of the sensor stack 302 to protect the sensor layers during manufacture. First and second hard bias layers 328, 330, constructed of a material such as CoFeCr, CoPt or CoPtCr, can be provided at either side of the sensor stack 302 to provide a magnetic bias field for biasing the magnetization of the free layer 310 in a desired direction parallel with the ABS as indicated by arrow symbol 332. The hard bias layers 328, 330 can each be separated from the sensor stack 302 and from at least one of the lead layers 304 by a thin insulation layer 334 in order to prevent sense current from being shunted through the hard bias layers 328, 330.

In operation, an electrical sense current is passed through the sensor stack 302 from one of the leads 306 to the other lead 304. In this way, the electrical resistance across the sensor stack can be measured. This resistance across the sensor stack varies with the relative orientations of the free layer magnetization 332 and pinned or reference layer magnetization 324. The closer these magnetizations are to being parallel to one another the lower the resistance will be, and the closer these magnetizations are to being anti-parallel the higher the resistance will be. As mentioned above, the magnetization 324 is pinned. However, the magnetization 332 is free to rotate in response to a magnetic field. Therefore, by measuring the change in electrical resistance across the sensor stack 302, the presence and strength of an external magnetic field can be sensed.

The width of the sensor stack 302 (and more particularly the width of the barrier layer 312 and free layer 310) determines the track width (TW) of the sensor 300. As discussed above, the track-width of the sensor is an important parameter, because a smaller track-width is needed to increase data density. Another important design parameter is the definition of the sides of the sensor stack 302, also referred to as the junction. Control of the side junctions 334, 336 includes controlling the angle of these sides and the smoothness of the side curvature, and also includes making sure that damage to the material layers at the sides is minimized and the amount of re-deposited material (re-dep) is minimized.

Figure 4:
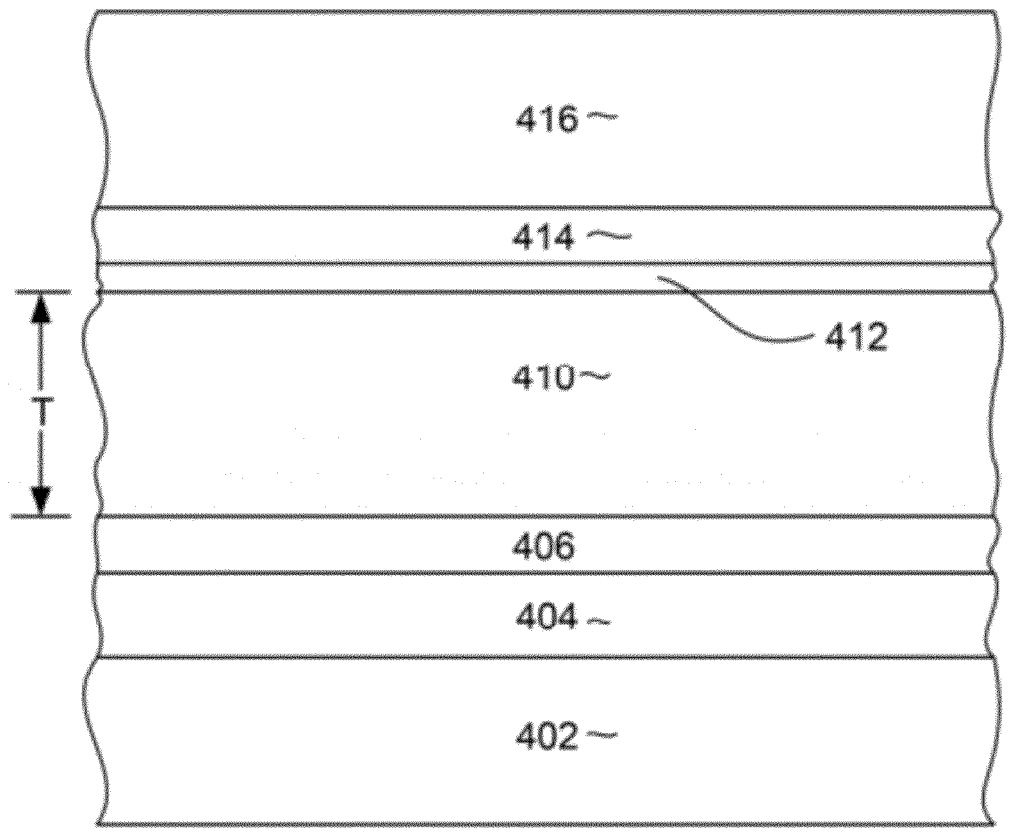
FIGS. 4-11 show an ABS view of a magnetoresistive sensor in various intermediate stages of manufacture in order to illustrate a method of manufacturing a magnetoresistive sensor according to an embodiment of the invention.

FIGS. 4-11, illustrate a method for manufacturing a magnetoresistive sensor that allows the track-width of the sensor to be reduced and uniform, while also maximizing side junction definition uniformity. With particular reference to FIG. 4, a lower magnetic, electrically conductive lead 402 is formed, and a plurality of sensor layers 404 are deposited over the lead 402. The lead 402 provides a substrate for the deposition of the sensor layers there-over. The sensor layers 404 can include layers that can form a sensor stack 302 such as that described with reference to FIG. 3. The sensor layers 404 could include layers of any of a number of other types of sensor too, with the sensor stack 302 of FIG. 3 being merely an example.

With continued reference to FIG. 4, an optional protective layer 406 can be deposited over the sensor layers. The optional protective layer 406 can be constructed of a material such as diamond like carbon (DLC) or amorphous carbon. A first etch mask 410 is deposited over the optional protective layer, and a second etch mask 412 is deposited over the first etch mask 410. The first etch mask 410 is deposited to a thickness T that together with thickness of second mask layer will define a desired mask height for a future ion milling operation that will be described herein below. The second etch mask 412 can be made significantly thinner than the first etch mask 410. A Bottom Anti-Reflective Coating (BARC) 414 can be deposited over the second etch mask 412 and a layer of photoresist 416 can be deposited over the (BARC) 414.

The first etch mask layer 410, and second etch mask layer are constructed of materials that are removable by different reactive ion etching processes. In other words, the first etch mask 410 is constructed of a material that is selectively removed by a reactive ion etching that leaves the second etch mask 412 substantially intact. Similarly, the second etch mask 412 is selectively removed by a reactive ion etching process that leaves the first etch mask substantially intact. In addition, the first etch mask 410 is constructed of a material that is resistant to ion milling. To this end, the first mask layer 410 can be constructed of a soluble polymer material such as DURIMIDE® or Polymethylglutarimide (PMGI).

The BARC layer 414 can be constructed of a material such as DURIMIDE®, ARC29, ARC30, ARC31®, etc. from Brewer Science® or any other suitable anti-reflective coating material that can be used for ArF or Krf Deep Ultra-Violet (DUV) photolithography.

Figure 5:
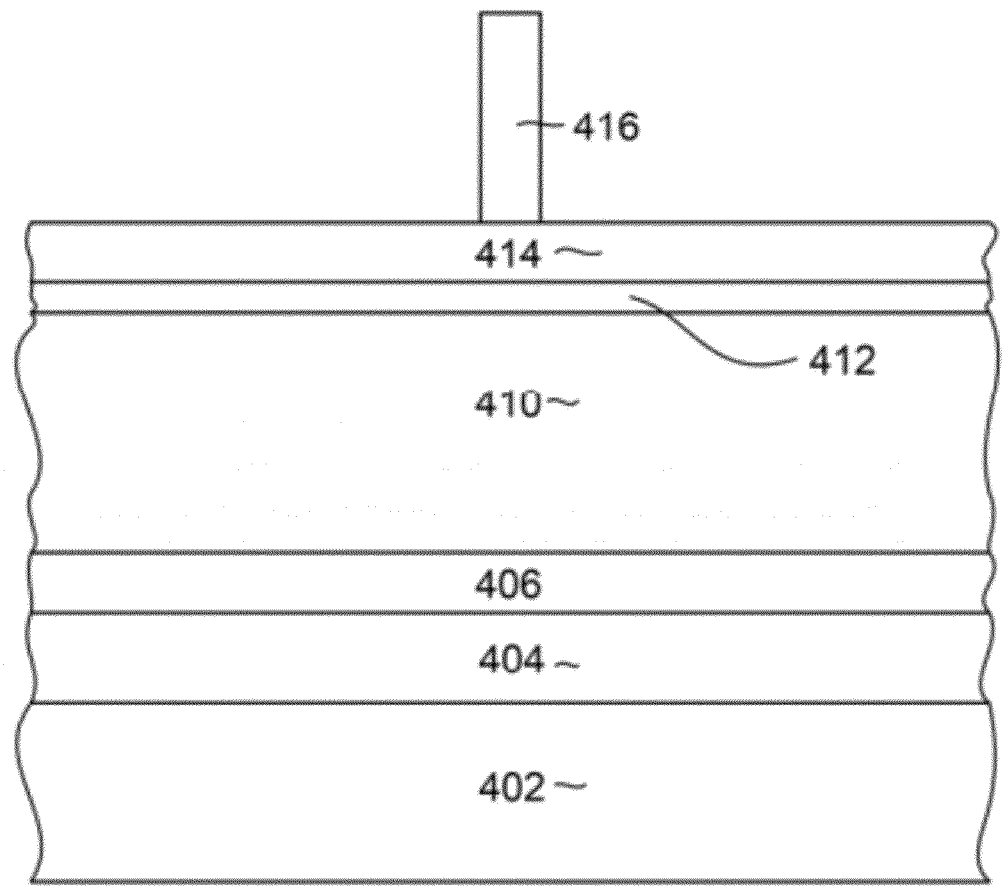

The photoresist layer 416 is then photolithographically patterned to form a track-width defining mask 416 as shown in FIG. 5. The photoresist layer 416 can be patterned by a high resolution photolithographic process such as in an ASML scanner using 248 nm wavelength KrF laser or 193 nm wavelength ArF laser. The presence of the BARC layer assists the photolithographic process by minimizing the reflection of light into the resist layer 416, which would otherwise adversely affect the patterning of the resist layer 416.

Figure 6:
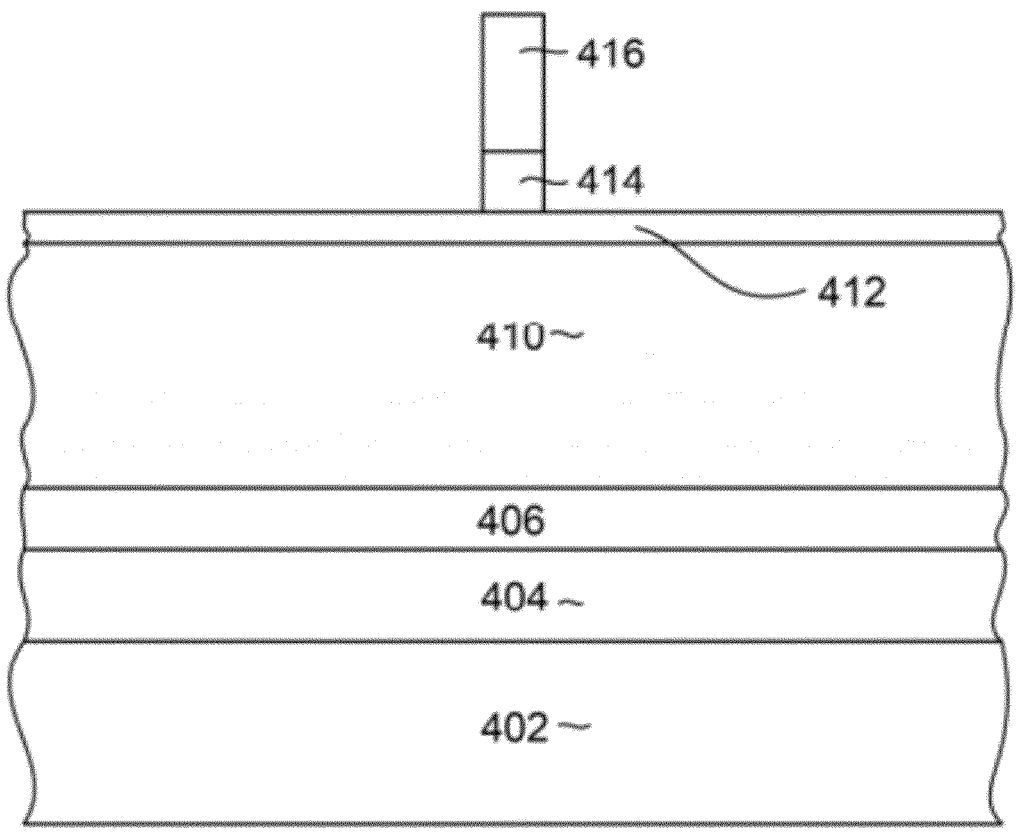

Then, the image of the photoresist mask 416 is transferred onto the underlying BARC layer by removing portions of the BARC layer that are not protected by the photoresist mask, leaving a structure such as that shown in FIG. 6. This can be done by performing a reactive ion etching (RIE) in an oxygen containing gas. This RIE process may also remove a portion of the photoresist mask 416 in the process, thereby narrowing the photoresist mask.

Figure 7:
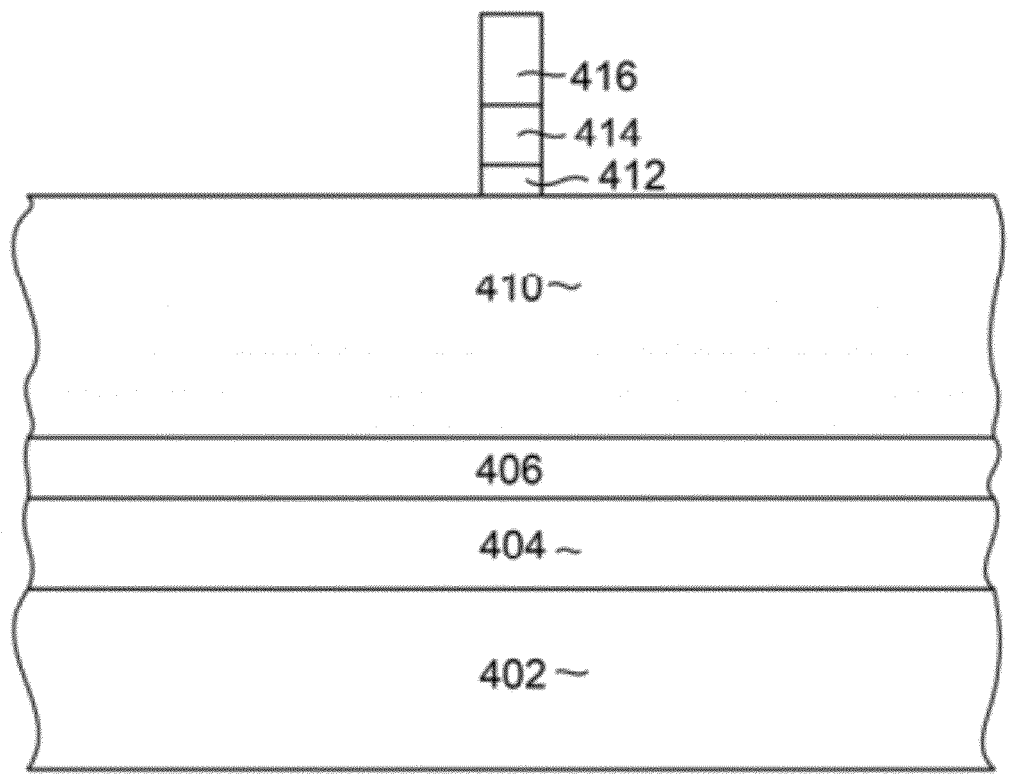

Then, with reference to FIG. 7, another reactive ion etching is performed to transfer the image of the photoresist mask 416 and BARC layer 414 onto the underlying second etch mask layer 412. If the second mask layer 412 is $SiO_2$, $SiN_x$ or $SiO_xN_y$, or SiC, the RIE can be performed using a fluorine containing gas.

Figure 8:
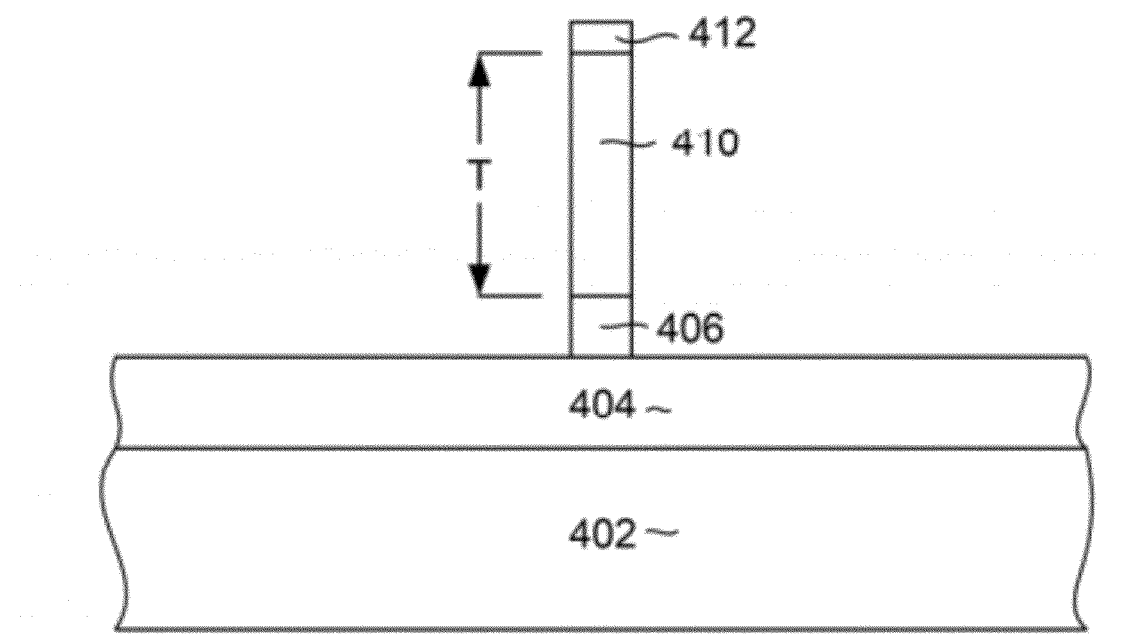

Then, with reference to FIG. 8, another reactive ion etching (RIE) is performed to transfer the image of the second etch mask layer 412 onto the underlying first etch mask layer 410. This RIE can be performed using an oxygen containing gas. This RIE (in an oxygen atmosphere) selectively removes portions of the first etch mask layer material 410 that are not protected by second mask 412, while leaving second etch mask layer material 412 substantially intact to serve as a mask during this reactive ion etching. This RIE removes the photoresist mask 416 and BARC layer 412 (FIG. 7) to leave the structure shown in FIG. 8. This RIE can also be used to etch the protective layer 406 as shown in FIG. 8. If the protective layer is diamond like carbon (DLC) or amorphous carbon, a plasma etch with oxygen containing gas may be used to remove the protective layer 406.

Figure 9:
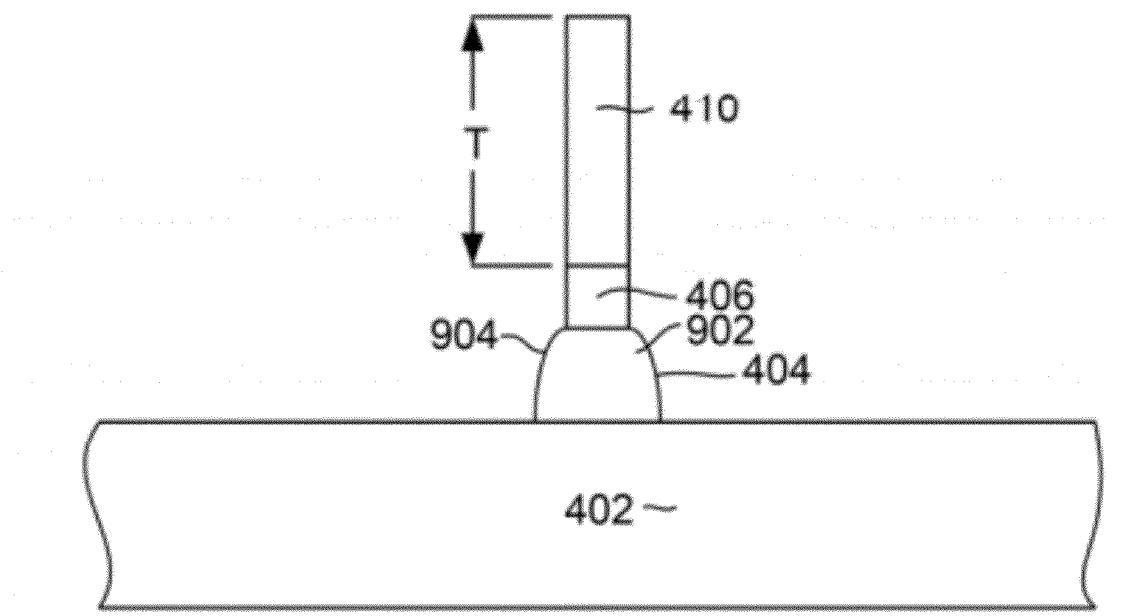

Then, with reference to FIG. 9, an ion milling is performed to remove portions of the sensor material 404 that are not protected by the mask layers 410 to form a sensor 404 as shown in FIG. 9. The ion milling process actually involves a series of ion milling operations performed at various angles relative to normal so as to form a sensor 404 with well defined sides (junction) that have little or no damage or re-deposited material (re-dep).

The formation of a read sensor has unique requirements that are not shared by the formation of other devices such as magnetic write heads or semiconductor devices, such as the necessity to form the sensor 404 with clean, well defined side junctions 902, 904. In order to accurately define the side junctions 902, 904, a certain well defined amount of shadowing from the mask layers 406, 410, 412 must be present during the ion milling, and this amount of shadowing must be consistent and well controlled. This means that the thickness of the protective layer 406 and thickness T of the first etch mask layer 410 and the thickness of the second mask layer 412 (shown in FIG. 8) can be easily and accurately controlled to desired design thicknesses through the above processes. The protection layer 406 is optional and is much thinner than that of 410 and thinner than that of 412. Therefore, its thickness is a very small portion of the total mask thickness, and its variation has a small impact on the overall mask thickness. The thickness of the second mask layer 412 is much thinner than that of the thickness T of the first etch mask layer 410 and it is substantially unchanged during the second RIE process used to etch the first etch mask layer 410, and its variation has a very small impact to the overall mask thickness. Previously disclosed processes resulted in a reduction of the overall mask thickness during formation of the mask. This made it impossible to control the overall thickness of the mask layers, especially at extremely narrow track widths, at the start of the ion milling process that defines the sensor junction. While the ion milling process will reduce the mask height, this process is repeatable, in that the starting mask height is consistent and easily controlled.

The above described process makes it possible to control mask thickness uniformly across wafer and controllably from wafer to wafer for the ion milling process that defines sensor junction. The ion milling mask consists of the first etch mask 410, second etch mask 412 and the optional protective layer 406. The thickness T of the first mask remains the exact thickness at which it was deposited. In other words, the thickness T is controlled by deposition of the layer 410, which can be accurately and consistently controlled. This is also true of the protective layer 406. The thickness of the second mask 412 is little changed by the second RIE process in FIG. 8 and its thickness at the start of ion milling process is substantially controlled by the deposition process that deposits it.

Figure 10:
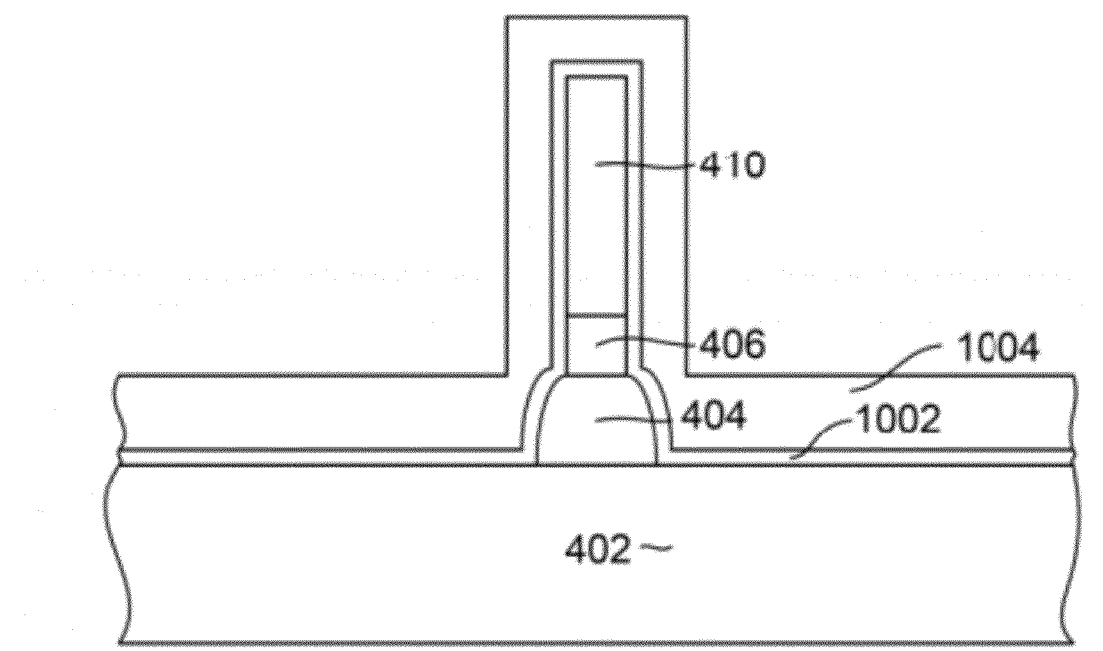
Figure 11:
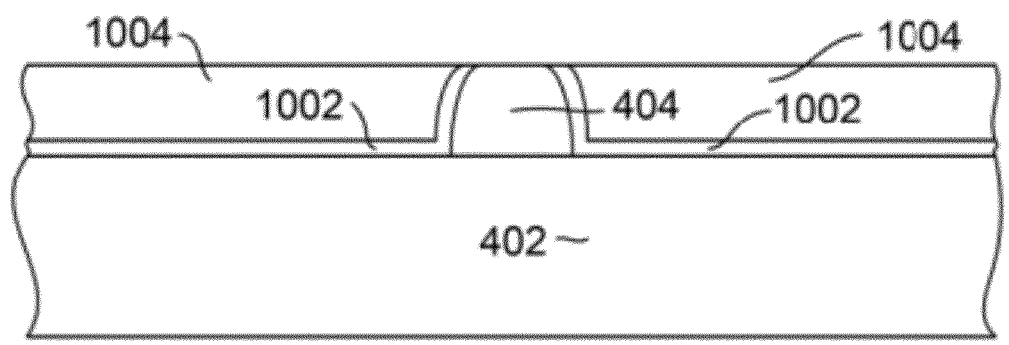

With reference now to FIG. 10, a thin layer of non-magnetic, electrically insulating material 1002 can be deposited, followed by a hard magnetic material 1004. One or more seed layers (not shown) may be deposited after the insulation layer 1002 and before the hard magnetic material 1004. The insulation layer 1002 can be alumina and can be deposited by atomic layer deposition. The hard bias material layer 1004 can be a material such as CoPt or CoPtCr and can be deposited by sputter deposition. One or more capping layers (not shown) may be deposited after the hard magnetic material 1004. Then, a liftoff process can be performed to remove the mask layers 406, 410. A chemical mechanical polishing process may be used as well, to assist the lift-off of the mask and to planarize the surface of the structure. This leaves a structure as shown in FIG. 11. Thereafter, a second shield can be deposited such as the shield 306 shown in FIG. 3.

Figure 12:
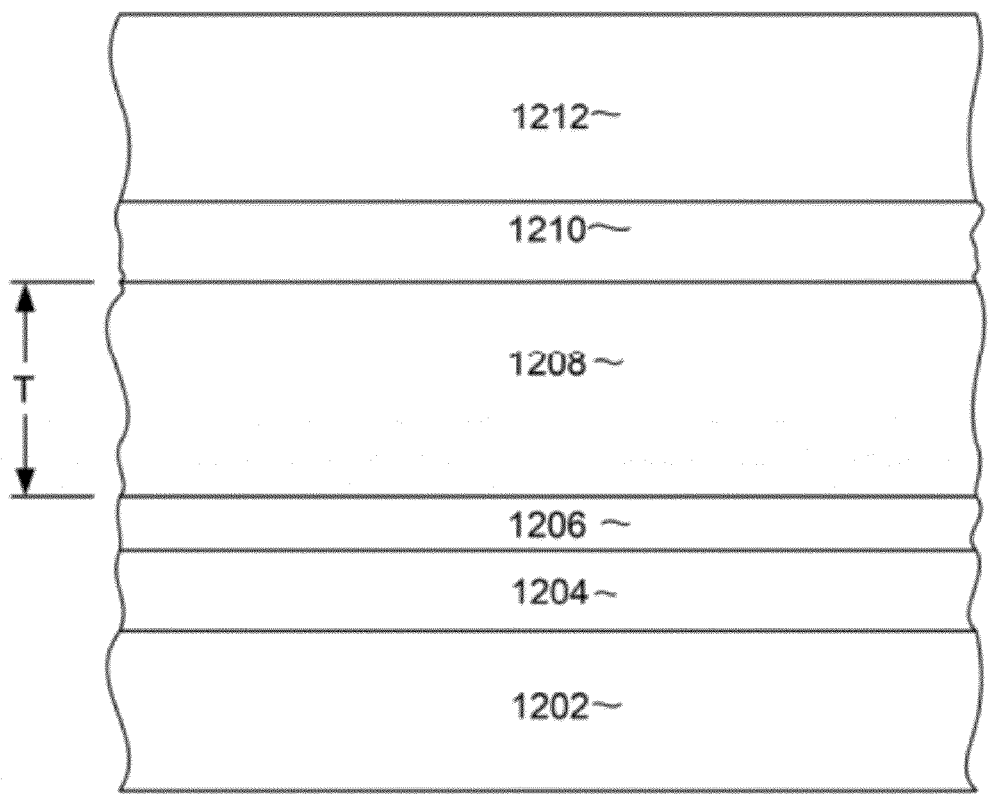
FIGS. 12-18 show an ABS view of a magnetoresistive sensor in various intermediate stages of manufacture in order to illustrate a method of manufacturing a magnetoresistive sensor according to an alternate embodiment of the invention.

FIGS. 12-18 illustrate an alternate method for manufacturing a sensor such as the sensor 300 shown in FIG. 3. With particular reference to FIG. 12, a first magnetic, electrically conductive lead/shield 1202 is formed, which provides a substrate for the formation of the other layers thereon. A series of sensor layers 1204 are then deposited over the substrate 1202. An optional protection layer 1206 can be deposited over the sensor layers 1204. A first etch mask layer 1208 is deposited over the optional protective layer 1206. The first etch mask can be constructed of a soluble polymer material such as DURIMIDE® or a PMGI material, and is deposited to a thickness T that is chosen to provide a desired mask height during a subsequent ion milling process used to form the sensor junction as will be described herein below.

With continued reference to FIG. 12, a layer 1210 is deposited over the first etch mask layer. This layer 1210 serves both as a second etch mask and also as a Bottom Anti-Reflective Coating layer. It is then a hybrid etch mask and BARC layer that will be referred to herein simply as an inorganic BARC layer 1210. The layer 1210 is constructed of a material that both serves as a bottom anti-reflective coating and also is removable by different RIE process than that used to remove the underlying first etch mask layer 1208. To this end, the layer 1210 can be constructed of an inorganic BARC material. Such materials that can function as inorganic anti-reflective coatings include a nitrogen-free dielectric anti-reflection film such as Dielectric Anti-Reflective Coating (DARC) or DARC 193 from Applied Materials, Inc. and Si-containing BARC such as SiHM® manufactured by ShinEtsu®, or UVAS® manufactured by Honeywell, inc. A layer of photoresist 1212 is deposited on top of the inorganic BARC layer 1210.

Figure 13:
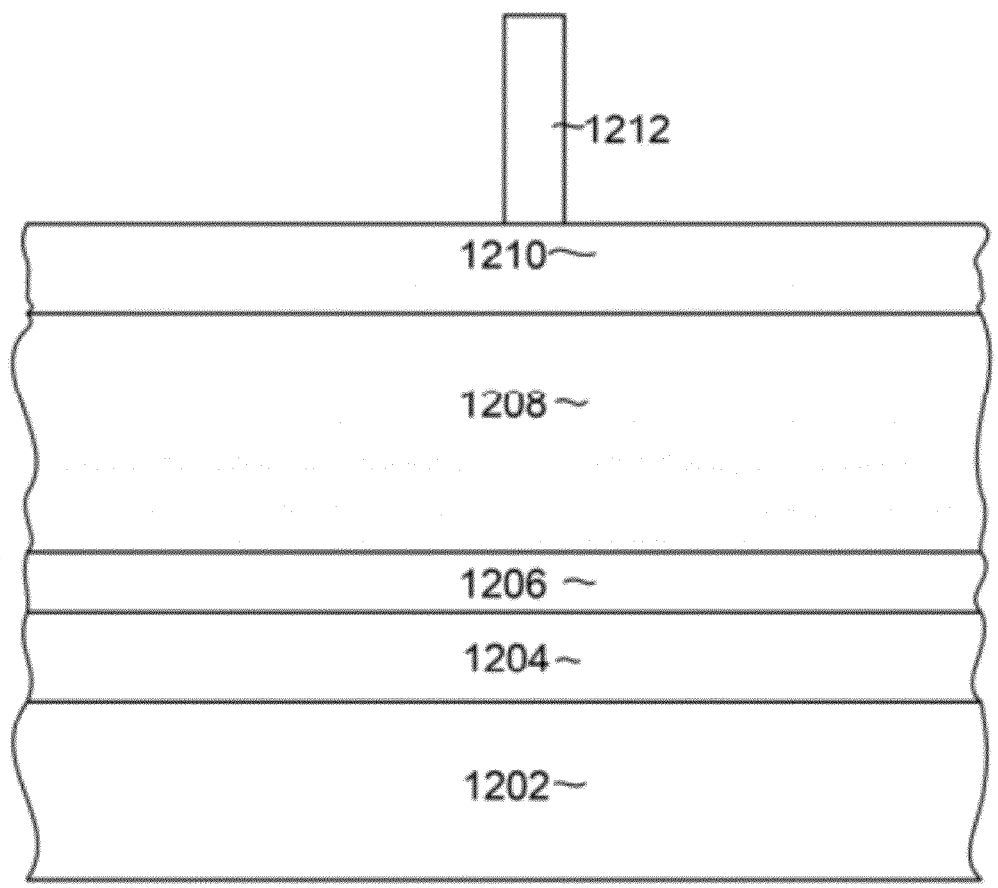
Figure 14:
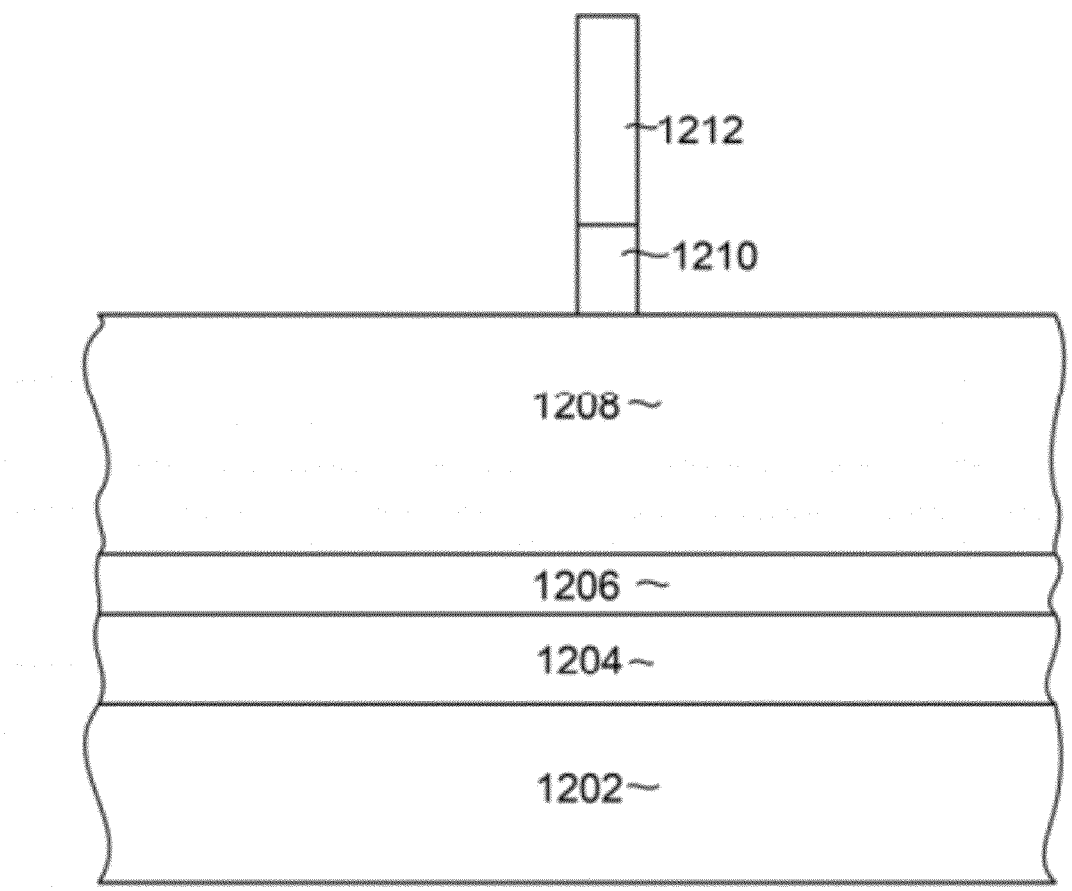

With reference now to FIG. 13, the photoresist layer 1212 is photolithograhically patterned (as described above) to form a photoresist mask. Then, a first reactive ion etching is performed to remove portions of the inorganic BARC layer 1210 that are not protected by the photoresist mask 1212, leaving a structure such as that shown in FIG. 14. This first reactive ion etching is performed in an appropriate atmosphere such as a fluorine containing atmosphere. This fluorine containing RIE readily removes the inorganic BARC layer 1210, but does not significantly affect the underlying first etch mask layer 1208.

Figure 15:
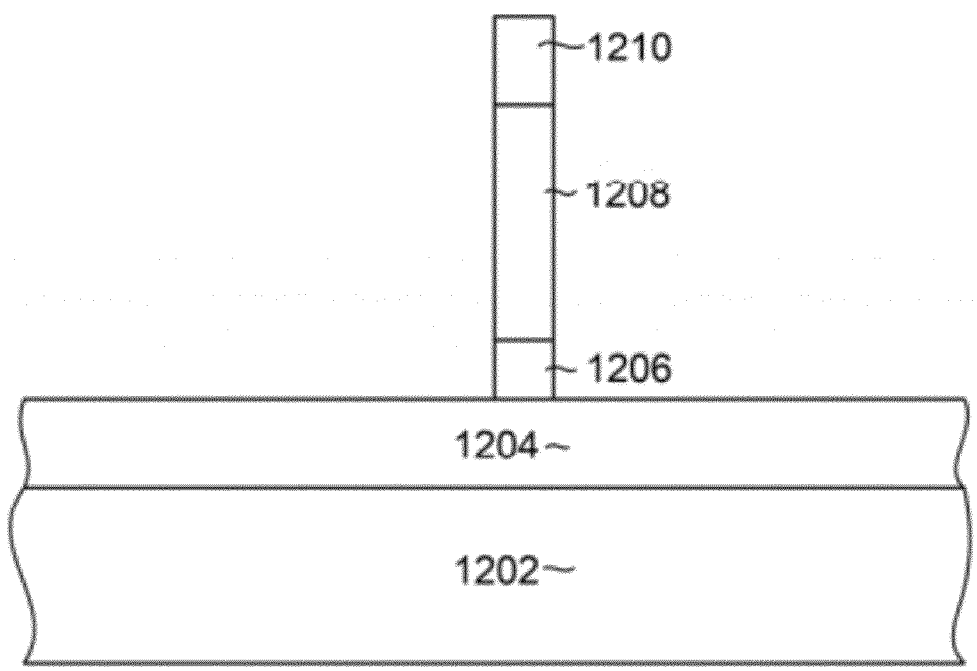

Then, another reactive ion etching (RIE) is performed to remove portions of the first etch mask layer 1208 that are not protected by the second etch mask layer 1210, leaving a structure as shown in FIG. 15. This second RIE is performed using an oxygen containing atmosphere (without fluorine) so that it readily removes the first etch mask layer 1208 not protected by the second etch mask, but leaves the inorganic BARC layer 1210 substantially intact. The second RIE also removes the remaining photoresist mask layer 1212 (FIG. 14), and may also be used to pattern the image of the mask layers 1208, 1210 onto the underlying optional protective layer 1206, if such a protective layer is used.

Figure 16:
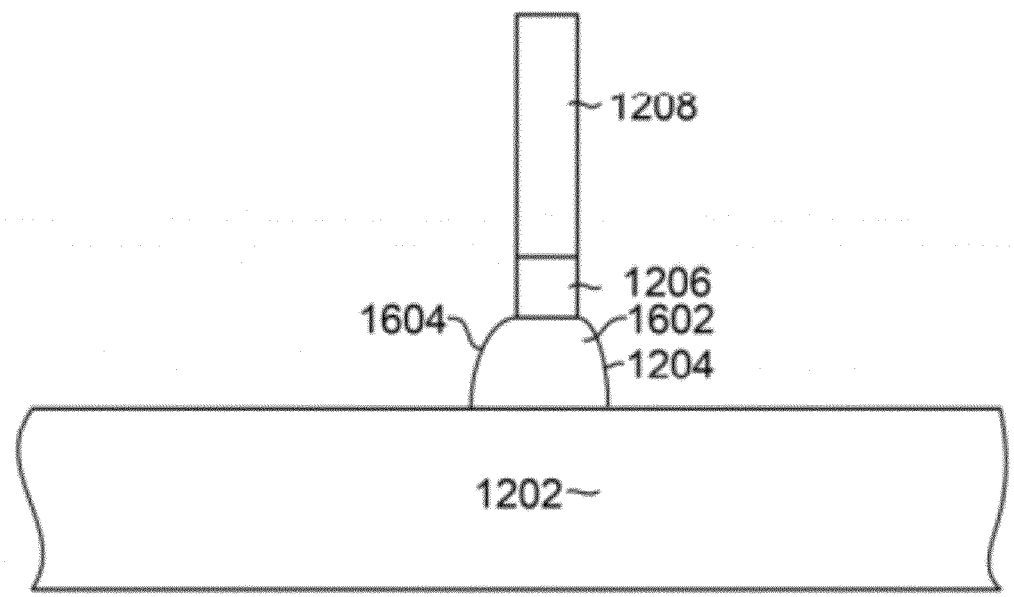

Then, with reference to FIG. 16, an ion milling process is performed to remove portions of the sensor material 1204 that are not protected by the mask layers 1206, 1208. As described above with reference to the previously described embodiment, the ion milling process includes a series of ion milling operations that are performed at various angles in order to form a sensor 1204 with clean, defect free, side walls 1602, 1604. Also as with the previously described process, the thickness T of the first etch mask layer 1208 is very accurately controlled and the thickness of the second mask is little changed by the second RIE process in FIG. 15 and its thickness at the start of ion milling process is substantially controlled by the deposition process that deposits it. The total mask thickness can be well controlled to a desired height before the ion milling used to form the sensor 1204. Therefore, for all of the reasons described above with regard to the previously discussed embodiment, the presently described embodiment allows for the formation of a well defined sensor structure at very narrow track-widths by controlling the total mask thickness for the ion milling process.

Figure 17:
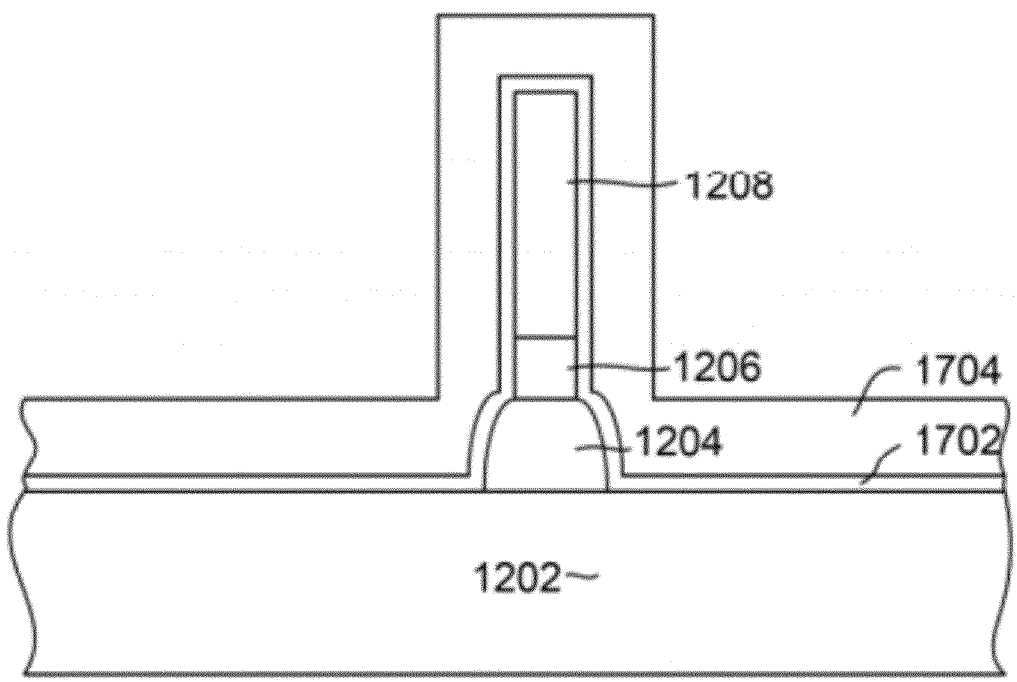
Figure 18:
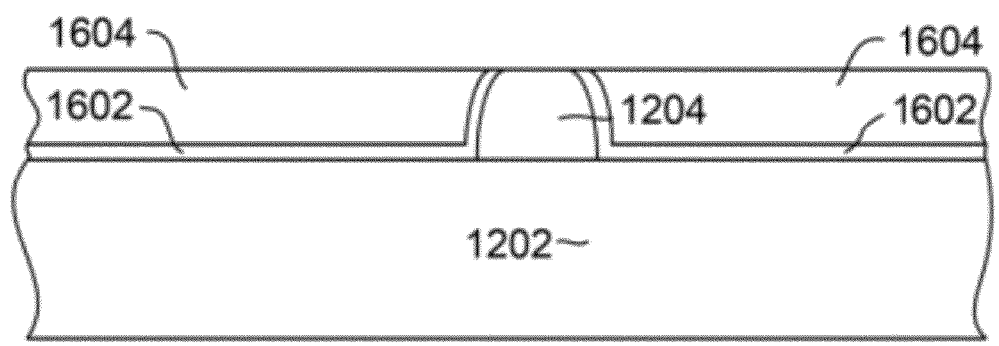

After forming the sensor 1204, a thin layer of electrically insulating material 1702 is deposited, followed by a layer of hard magnetic bias material 1704, and seed layers and capping layers (not shown in FIG. 17), resulting in a structure such as shown in FIG. 17. Then, a liftoff process, which may include chemical mechanical polishing (CMP) is performed, leaving a structure such as shown in FIG. 18.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for manufacturing a magnetoresistive sensor, comprising:
   forming a substrate;
   depositing a plurality of sensor layers onto the substrate;
   after depositing the plurality of sensor layers, depositing a first etch mask layer, the first etch mask layer being deposited to a thickness (T);
   depositing a second etch mask layer onto the first etch mask layer wherein the first etch mask layer is removable by reactive ion etching in a first chemistry and is resistant to removal by a reactive ion etching in a second chemistry, and the second etch mask is removable by reactive ion etching in the second chemistry and is resistant to removal by reactive ion etching in the first chemistry;
   depositing a bottom anti-reflective coating over the second etch mask layer;
   depositing a photoresist layer over the bottom anti-reflective layer;
   developing the photoresist layer to form a photoresist mask;
   transferring the image of the photoresist mask onto the bottom anti-reflective coating;
   performing a reactive ion etching in the second chemistry to transfer the image of the photoresist mask and bottom anti-reflective coating onto the underlying second mask layer;
   performing a reactive ion etching in the first chemistry to transfer the image of the second etch mask layer onto the underlying first etch mask layer;
   performing an ion milling process to form first and second side walls on the plurality of the sensor layers, the ion milling process being performed at various angles to form the sides as clean, uniform, well defined side walls and;
   after performing the ion milling, depositing a thin layer of insulation, then depositing a layer of hard magnetic bias material, then lifting off the first etch mask layer.

2. The method as in claim 1 further comprising, after performing the ion milling, depositing a thin layer of insulation, and then depositing a layer of hard magnetic bias material.

3. The method as in claim 1 wherein the first etch mask layer comprises a soluble polymer or PMGI.

4. The method as in claim 1 wherein the second etch mask comprises $SiO_2$, $SiN_x$, $SiO_xN_y$, SiC, Ta, or $Al_2O_3$.

5. The method as in claim 1 wherein the first etch mask comprises soluble polymer or PMGI and the second etch mask comprises $SiO_2$, $SiN_x$, $SiO_xN_y$, SiC, Ta, or $Al_2O_3$.

6. The method as in claim 1 wherein the first chemistry comprises oxygen.

7. The method as in claim 1 wherein the second chemistry comprises fluorine.

8. The method as in claim 1 wherein the first chemistry comprises oxygen and the second chemistry comprises fluorine.

9. The method as in claim 1 wherein:
   the first etch mask layer comprises a soluble polymer material or PMGI;
   the second etch mask layer comprises $SiO_2$, $SiN_x$, $SiO_xN_y$, SiC, or Ta;
   the first chemistry comprises oxygen; and
   the second chemistry comprises fluorine.

10. The method as in claim 1 wherein the photoresist layer is patterned to form a photoresist mask having a width of less than 80 nm.

11. A method for manufacturing a magnetoresistive sensor, comprising:
    forming a substrate;
    depositing a plurality of sensor layers onto the substrate;
    after depositing the plurality of sensor layers, depositing a first etch mask layer, the first etch mask layer being deposited to a thickness (T);
    depositing an inorganic bottom anti-reflective coating over the first etch mask layer wherein the first etch mask layer is removable by reactive ion etching in a first chemistry and is resistant to removal by a reactive ion etching in a second chemistry, and the bottom anti-reflective coating is removable by reactive ion etching in the second chemistry and is resistant to removal by reactive ion etching in the first chemistry, so that it functions as both a second etch mask layer and also as a bottom anti-reflective coating;
    depositing a photoresist over the inorganic bottom anti-reflective layer;
    patterning the photoresist layer to form a photoresist mask;
    performing a reactive ion etching in the second chemistry to transfer the image of the photoresist mask onto the underlying bottom anti-reflective coating layer;
    performing a reactive ion etching in the first chemistry to transfer the image of the bottom anti-reflective coating layer onto the underlying first etch mask layer;
    performing an ion milling process to form first and second side walls on the plurality of the sensor layers, the ion milling process being performed at various angles to form the sides as clean, uniform, well defined side walls; and
    after performing the ion milling, depositing a thin layer of insulation, then depositing a layer of hard magnetic bias material, then lifting off the first etch mask layer.

12. The method as in claim 11 further comprising, after performing the ion milling, depositing a thin layer of insulation, then depositing a layer of hard magnetic bias material.

13. The method as in claim 11 wherein the inorganic bottom anti-reflective coating layer comprises DARC or Si-containing BARC.

14. The method as in claim 11 wherein the first etch mask comprises soluble polymer or PMGI and the inorganic bottom anti-reflective coating layer comprises DARC or Si-containing BARC.

15. The method as in claim 11 wherein the first chemistry comprises oxygen.

16. The method as in claim 11 wherein the second chemistry comprises fluorine.

17. The method as in claim 11 wherein the first chemistry comprises oxygen and the second chemistry comprises fluorine.

18. The method as in claim 11, wherein:
    the first etch mask layer comprises a soluble polymer or PMGI;
    the inorganic bottom anti-reflective coating layer comprises DARC or Si-containing BARC;
    the first chemistry comprises oxygen; and
    the second chemistry comprises fluorine.

19. The method as in claim 11 wherein the photoresist layer is patterned to form a photoresist mask having a width of less than 80 nm.

20. The method as in claim 11 wherein the first etch mask layer comprises a soluble polymer or PMGI.

* * * * *